United States Patent [19] [11] 3,904,888

Griffin et al. [45] Sept. 9, 1975

[54] CIRCUITS EXHIBITING HYSTERESIS USING TRANSISTORS OF COMPLEMENTARY CONDUCTIVITY TYPE

[75] Inventors: Roger Thomas Griffin, Flackwell, Great Britain; Daniel Lee Hillman, High Bridge, N.J.

[73] Assignee: RCA Corporation, New York, N.Y.

[22] Filed: July 5, 1974

[21] Appl. No.: 486,232

[30] Foreign Application Priority Data

May 17, 1974 United Kingdom.............. 22048/74

[52] U.S. Cl. ................ 307/205; 307/214; 307/215; 307/279; 307/288

[51] Int. Cl.²...H03K 1908; H03K 1940; H03K 1936

[58] Field of Search........ 307/205, 214, 215, 221 C, 307/225 C, 279, 288, 290

[56] References Cited

UNITED STATES PATENTS

| | | | |
|---|---|---|---|
| 3,551,693 | 12/1970 | Burns et al. | 307/279 X |
| 3,716,723 | 2/1973 | Heuner et al. | 307/221 C |
| 3,716,724 | 2/1973 | Parrish et al. | 307/221 C |
| 3,720,841 | 3/1973 | Suzuki et al. | 307/221 C |
| 3,753,009 | 8/1973 | Clapper | 307/279 |
| 3,766,408 | 10/1973 | Suzuki et al. | 307/279 X |

*Primary Examiner*—Michael J. Lynch
*Assistant Examiner*—L. N. Anagnos
*Attorney, Agent, or Firm*—H. Christoffersen; Henry I. Schanzer

[57] ABSTRACT

The circuits include a complementary inverter, comprised of first and second transistors responsive to an input signal, and means responsive to the input signal, for placing the conduction paths of additional transistors in parallel with the conduction path of the first or the second transistor. The conductivity of the additional transistors is controlled by a feedback signal derived from the output of the inverter. When an inverter transistor is turned on the additional transistors connected across it are also turned on causing the equivalent impedance of the "ON" portion of the circuit to be much lower than the "ON" impedance of either one of the inverter transistors.

16 Claims, 5 Drawing Figures

CIRCUITS EXHIBITING HYSTERESIS USING TRANSISTORS OF COMPLEMENTARY CONDUCTIVITY TYPE

This invention relates to semiconductor circuits exhibiting hysteresis. That is, the value of input signals for which the output signal of these circuits switches depends on whether the input signal is increasing or decreasing. Circuits exhibiting hysteresis have increased noise immunity and are therefore extremely useful for reliable operation in an electrically noisy environment.

The invention is best understood and explained with reference to the accompanying drawings in which like reference characters denote like components; and in which FIG. 1 is a schematic drawing of a prior art circuit exhibiting hysteresis;

Circuits exhibiting hysteresis are disclosed, for example, in U.S. Pat. No. 3,612,908 entitled "Metal Oxide Semiconductor (MOS) Hysteresis Circuits." FIG. 7 of that patent has been redrawn as FIG. 1 and labelled "Prior Art". In the patented circuit, metal oxide transistors of P-conductivity type are used. These transistors have a gate electrode, and source and drain electrodes defining the ends of a conduction path. The source electrode is identified by an arrow pointing towards the body of the P-type transistors.

Figure 1:
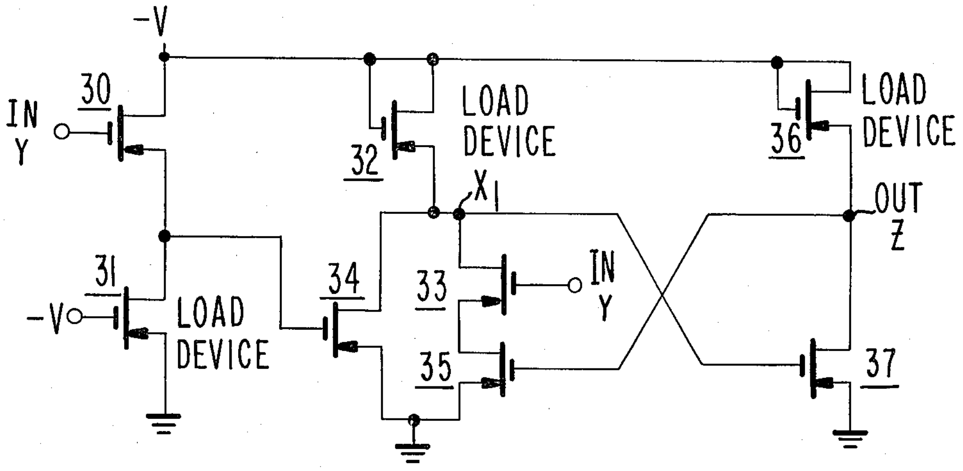
PRIOR ART FIG. 1

In the circuit of FIG. 1 hereof, transistor 30 functions as a source follower and transistor 31 functions as a passive load device. Transistor 30 is connected at its drain to $-V$ volts, at its gate to input signal terminal Y and at its source to the drain of transistor 31 and to the gate of transistor 34. Transistor 31 is connected at its gate to $-V$ volts and at its source to ground potential. The gates of transistors 33 and 35 are connected to input terminal Y and output terminal Z, respectively. Transistors 33 and 35 have their conduction paths connected in series across the conduction path of transistor 34. The sources of transistors 34 and 35 are connected to ground potential and the drains of transistors 33 and 34 are connected to terminal $X_1$. Transistor 32, connected at its source to terminal $X_1$ and at its gate and drain to $-V$ volts, functions as a passive load device. Transistors 36 and 37 form an inverter with transistor 37 functioning as an amplifying device and transistor 36 as a passive load device. Transistor 37 is connected at its gate (input to inverter) to terminal $X_1$ and at its drain, (output of inverter and output terminal Z) to the gate of transistor 35 and to the source of transistor 36.

The operation of the circuit of FIG. 1 is best explained by assuming that the input signal applied to terminal Y is initially at 0 volts, then makes a negative going excursion to $-V$ volts and then returns to 0 volts.

When the input signal is at 0 volts, transistors 30, 33 and 34 are cut off. The potential at terminal $X_1$ is close to $-V$ volts. This turns on transistor 37 causing the potential at terminal Z to be closed to 0 volts, which in turn cuts off transistor 35.

When the input signal goes negative and equals $-V_T$ volts transistors 30 and 33 are turned on. ($V_T$ is the threshold voltage of the transistors, and is equal to the minimum gate-to-source voltage necessary to turn a transistor on. For ease of explanation it is assumed that all the transistors have a similar $V_T$.) But, the potential applied to the gate of transistor 34 is more positive than $-V_T$ volts due to the $V_T$ offset of transistor 30. Accordingly, transistor 34 remains cut off, the potential at $X_1$ remains at $-V$ volts, and transistor 35 also remains cut off.

When the input signal goes more negative than $-2V_T$ volts, transistor 34 is turned on and the potential at $X_1$ is eventually brought to, or close to, ground potential. The signal at output terminal Z goes close to $-V$ volts and transistor 35 is turned on. Since transistor 33 was already on, transistors 33, 34 and 35 conduct and clamp $X_1$ at, or close to, 0 volts. Thus, the input signal must equal or exceed $-2V_T$ volts to cause $X_1$ to go to 0 volts and the potential at Z to go to $-V$ volts. Note that the $-2V_T$ volts is in fact the threshold voltage of transistor 30 added to the threshold voltage of transistor 34.

Assume now that the signal starts going positive from $-V$ volts toward 0 volts. When the input signal becomes more positive than $-2V_T$ volts, transistor 34 is cut off. But, transistors 33 and 35 are still conducting and the potential at $X_1$ remains at, or close to, ground potential. It is only when the input signal goes slightly more positive than $-V_T$ volts that transistor 33 cuts off. The potential at $X_1$ is then discharged close to $-V$ volts through the conduction path of transistor 32. When $X_1$ goes sufficiently negative, transistor 37 is turned on and the signal at output terminal Z goes positive toward 0 volts. The zero volt signal fed back to the gate of transistor 35 cuts it off. Thus, for positive going signals, the switching point of the circuit is set by the threshold voltage ($V_T$) of transistor 33.

In the circuit of FIG. 1, the threshold voltages of the transistors control the switching points of the circuit. But, the threshold voltage of transistor is a difficult parameter to control. The threshold voltages of different transistors on the same integrated circuit chip often have different values and there is little repeatability in the threshold voltages of transistors on different chips. It is, therefore, desirable to have a circuit in which the switching point is controlled by a more repeatable and controllable parameter such as the sizes of the transistors. The sizes of the transistors and, even more, the ratio of the size of one transistor to another is much more controllable and predictable than the actual threshold voltage of each transistor.

In the operation of the circuit of FIG. 1, terminal $X_1$, for one signal condition, is clamped to ground by means of transistors 33, 34 and 35 and, for another signal condition, is coupled to $-V$ volts by passive load device 32. The potential at $X_1$ thus charges relatively quickly to zero volts through transistors 34 or 33 and 35 and discharges relatively slowly to $-V$ volts through the conduction path of transistor 32. The charging and discharging of terminal $X_1$ is thus not at all symmetrical. Accordingly, the waveforms produced at output Z have different fall times and rise times and different propagation delays depending on whether the signal is rising or falling. In many circuit applications it is highly desirable that the output waveforms have nearly identical rise and fall times and propagation delays.

In the operation of the circuit of FIG. 1 when transistors 33, 34 and 35 are turned on, current flows through their conduction paths and through transistor 32 between ground and −V volts. Similarly, when transistor 30 is turned on or when transistor 37 is turned on current flows through the conduction paths of transistors 30 and 31 or through the conduction paths of transistors 36 and 37. The circuit of FIG. 1, thus, almost always draws current with a corresponding constant, relatively high, power dissipation. In many circuit applications the minimization of power dissipation is of prime importance. It is, therefore, desirable to have circuits exhibiting hysteresis in which the power dissipation is minimized.

In circuits embodying the invention, the disadvantages of the prior art circuit, discussed above, are partly or wholly eliminated.

Circuits embodying the invention include means connecting the conduction path of a first transistor between a first power terminal and an output terminal and means connecting the conduction path of a second transistor between the output terminal and a second power terminal. The circuit further includes means for coupling the conduction path of at least one additional transistor between the output terminal and each power terminal. The circuit includes means for applying an input signal to the first and second transistors and to the coupling means, and means for applying a feedback signal, derived from the output terminal, to the control electrodes of the additional transistors.

Circuits embodying the invention are illustrated using insulated gate field effect transistors (IGFETs). However, it is to be understood that any other suitable type of transistors — e.g. depletion type IGFETs, bipolar transistors, or junction field effect devices — may be used to practice the invention. IGFETs have two main electrodes, referred to as the source and drain, defining the ends of a conduction path and a control electrode (gate) whose applied potential determines the conductivity of the conduction path. For IGFETs of P-conductivity type the source is defined as that electrode of the two main electrodes having the most positive potential applied thereto and is identified in the drawings by an arrow pointing towards the body of the transistor. For IGFETs of N-conductivity type the source is defined as that electrode of the two main electrodes having the less positive potential applied thereto and is identified in the drawings by an arrow pointing away from the body of the transistor.

IGFETs are bi-directional in the sense that when an enabling signal is applied to the control electrode current can flow in either direction in the conduction path defined by the first and second electrodes.

IGFETs of complementary conductivity type are used in circuits embodying the invention. In the drawings, transistors of P-conductivity are identified by the letter P followed by a numeral and transistors of N-conductivity type are identified by the letter N followed by a numeral.

Figure 2:
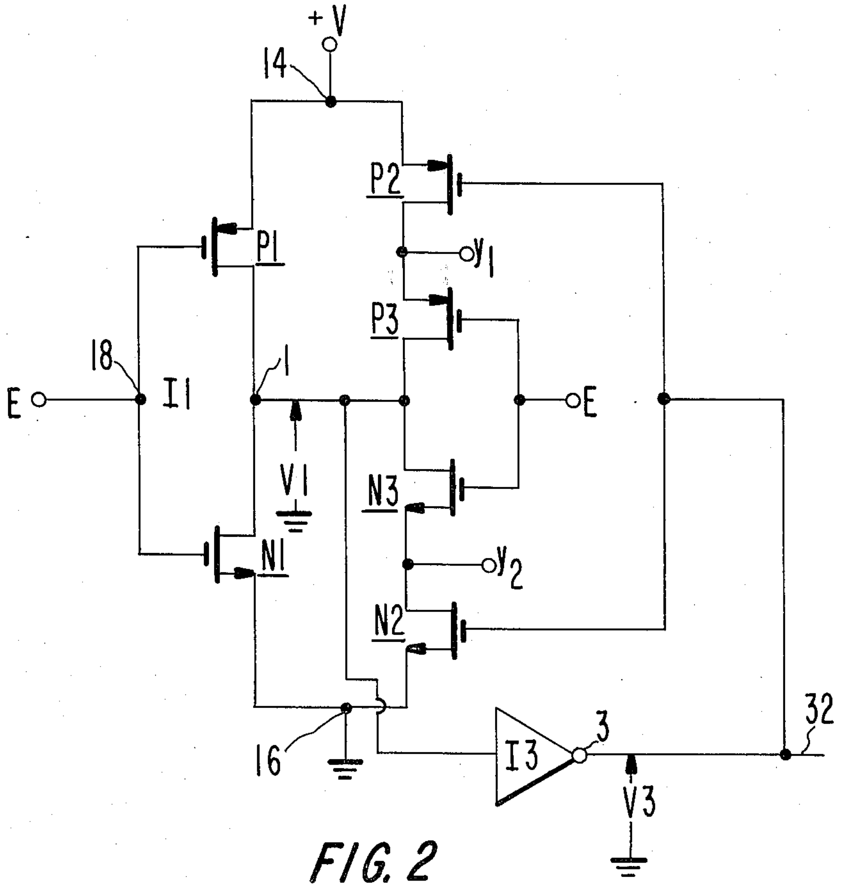
FIG. 2 is a schematic diagram of a hysteresis circuit, embodying the invention.

Referring to the circuit of FIG. 2, complementary inverter I1 includes transistors P1 and N1. Transistor P1 is connected at its source to terminal 14 at its drain to terminal 1 and at its gate to terminal 18. Transistor N1 has its source connected to terminal 16, its drain connected to terminal 1 and its gate to terminal 18. Transistors P2 and P3 have their source-drain paths connected in series between terminals 14 and 1 and transistors N2 and N3 have their source-drain paths connected in series between terminals 1 and 16. An input signal, labelled E, is applied to the gate electrodes of transistors P1, N1, P3 and N3. An inverter I3 is connected at its input to terminal 1 and at its output terminal 3 to the gate electrodes of transistors P2 and N2. Inverter I3 is, preferably, of the same type as inverter I1 but may also be any other suitable inverting means. The more positive operating potential labelled +V, is applied to terminal 14 and the more negative operating potential (ground in this example) is applied to terminal 16.

In the discussion of the operation of the circuits to follow: (1) the potential at terminals 1 and 3 will be referred to as V1 and V3 respectively; (2) it is assumed that the switching point of inverter I3 occurs at 50% of +V volts (i.e., V/2). That is, when V1 is more positive than V/2, V3 is at, or close to, 0 volts; and when V1 is more negative than V/2, V3 is at, or close to, +V volts. (3) a potential at, or close to, +V volts is referred to as a high signal and a potential at, or close to, zero volts is referred to as low signal; (4) it is assumed that all the transistors of N conductivity type have the same threshold voltage ($V_{TN}$) and all the transistors of P-conductivity type have the same threshold voltage ($V_{TP}$). The off impedance of each transistor is many orders of magnitude greater than its ON impedance; and (5) the impedance of a transistor is sometimes expressed by the letter Z with a subscript identifying the transistor. The impedance of a transistor refers to the equivalent impedance of the conduction path between its source and drain electrodes. The impedance of a transistor varies as a function of its gate to source potential ($V_{GS}$). The impedance decreases asymptotically with increasing $V_{GS}$ going from an extremely high value when the transistor is turned off (i.e. $V_{GS}$ less than $V_T$) to a relatively constant value when $V_{GS}$ is much greater than $V_T$. When the transistor is cut off, it may be considered to be an open switch.

The operation of the circuit of FIG. 2 may be described by assuming that the input signal E goes from zero volts to +V volts and then returns to zero volts. With E at zero volts transistors P1 and P3 are turned on and transistors N1 and N3 are turned off. The potential V1 at terminal 1 is high (at or near +V volts) causing the potential V3 at the output of inverter I3 to be low (at or close to zero volts). Accordingly, transistor P2 is turned on and transistor N2 is turned off. Thus, for the condition of $E=0$ volts, transistors P1, P2 and P3 are turned on and transistors N1, N2 and N3 are turned off. The impedance of the network between terminals 1 and 14 is equal to the impedance of transistor P1 in parallel with the series impedances of transistors P2 and P3. The impedance of the network between terminals 1 and 14 is, therefore, substantially less than the impedance of transistor P1 alone. The impedance of the network between terminals 1 and 16 is extremely high and there is, therefore, little if any current flowing between terminals 14 and 16.

As E increases in value to $V_{TN}$ volts, the threshold voltage of transistors N1 and N3 is reached. Transistor N1 is turned on, but its impedance, though considerably reduced, is still high in comparison to the equivalent impedance of transistors P1, P2 and P3, which are fully on. By voltage divider action V1 remains high. Accordingly, the potential V3 fed back to the gates of transistors N2 and P2 is low, maintaining transistor P2 on and transistor N2 off. Note that the signal E applied to the gate of transistor N3, though sufficient to turn transistor N3 on, does not cause conduction through that transistor since transistor N2 in series with it is still cut off.

Assume also for ease of explanation that when $E=V/2$ that the impedance ($Z_{N1}$) of transistor N1 is equal to the impedance ($Z_{P1}$) of transistor P1. Thus, when E increases to V/2 volts, $Z_{N1}$ is equal to $Z_{P1}$. But, since transistors P2 and P3 are still on, the potential V1 is still high and V3 remains low.

As E increases above V/2, the trigger point ($E_p$) for the positive going input signal is reached. The trigger or switching point is that value of input signal which causes the output of the circuit to switch from one state (e.g., high or low) to another state (e.g., low or high).

The trigger point ($E_p$) for positive going signals is reached when the conduction of transistors P1 and P3 is sufficiently decreased and the conduction of transistor N1 is sufficiently increased to cause V1 to be less than V/2 volts. That is, $E_P$ is reached as soon as the impedance ($Z_{N1}$) of transistor N1 becomes less than the impedance ($Z_{P1}$) of transistor P1 in parallel with the series connected impedances ($Z_{P2}+Z_{P3}$) of transistors P2 and P3.

When V1 becomes less than V,/2 V3 goes high turning off transistor P2 and turning on transistor N2. Transistors N2 and N3 are now fully on and their conduction paths are connected in series between terminals 1 and 16. The conduction path of transistor N1 is connected in parallel with the series combination of transistors N2 and N3. Transistors N1, N2 and N3 thus clamp terminal 1 through a relatively low equivalent impedance.

As E increases further and reaches a value of ($+V-V_{TP}$) volts, or more, transistor P1 as well as transistors P2 and P3 are cut off. With transistors P1, P2 and P3 cut off there is an extremely high impedance between terminals 1 and 14. For this static condition there is little, if any, current flowing between terminals 14 and 16 and, therefore, little, if any, power dissipation in the circuit.

It will now be shown that the signal levels established at terminals 1 and 3 are maintained until E decreases to a value $E_N$ which is considerably below $E_P$, where $E_N$ is defined as the trigger point for negative going signals.

As E decreases from +V volts to ($V-V_{TP}$) volts, transistor P1 is turned on. However, transistor P1 is only barely on, while transistors N1, N2 and N3 are still fully on. Accordingly, by voltage divider action V1 is low and V3 is high causing transistor P2 to remain off and transistor N2 to remain on.

As E decreases still further to V/2 volts, the impedance of transistor P1 is equal to that of transistor N1. But, transistors N2 and N3 are still on and maintain V1 belowV/2 , causing V3 to still be high and transistor P2 to be off.

As E decreases further, the negative trigger point $E_N$ is reached. This occurs when the condition of transistors N1 and N3 is decreased sufficiently and the conduction of transistor P1 is increased sufficiently so that the impedance ($Z_{P1}$) of transistor P1 is less than the impedance ($Z_{N1}$) of transistor N1 in parallel with the series impedances ($Z_{N2}+Z_{N3}$) of transistors N2 and N3. By voltage divider action, V1 becomes greater than +V/2 volts, and V3 goes from high to low. Transistor P2 is then turned on and N2 is turned off.

When E becomes less than $V_{TN}$ volts, transistors N1 and N3 are cut off and there is a high impedance between terminals 1 and 16. Transistors P1 and P2 and P3 clamp terminal 1 to terminal 14 through a relatively low impedance. But, due to the extremely high impedance of the N-type transistors there is little, if any, current flowing between terminals 14 and 16 and there is little, if any, power dissipation.

It is important to note that the positive and negative triggering points of the circuit are controlled by the ratio of the impedances of the transistors of the circuit. That is, V1 and hence $E_N$ and $E_P$ are controlled by the ratio of the impedances of the N type transistors to that of the P type transistors. The impedances of the transistors (for a given $V_{GS}$) are primarily a function of the sizes of the transistors and only a minor function of their threshold voltage. The sizes of the transistors is a parameter which is relatively well defined and which is much more controllable than the threshold voltage.

In addition, by relying on the ratio of the impedances of the devices, device parameter variations are substantially eliminated. For, whatever, happens to one device during processing also occurs to the others. Thus, relying on the ratio of the devices is a highly effective method of obtaining repeatability.

It is evident from an examination of the circuit operation that there is symmetrical operation. That is, for one input signal condition ($E=E_N$), output terminal 1 is clamped to +V volts by means of transistors P1, P2 and P3 and for another signal condition ($E=E_P$) the output is clamped to ground by means of transistors N1, N2 and N3. The speed of response of the circuit, once the trigger point is reached, should be very similar and fast for the positive and negative going signal directions. Thus, the propagation delays as well as the rise times and fall times, should be very similar.

In the circuit of FIG. 2, transistors P3 and N3 are connected in series with the conduction paths of transistors P2 and N2 respectively. They function to effectively either couple or disconnect the conduction paths of transistors P2 and N2 from the circuit. That is, when transistor P3 is off the conduction path of transistor P2 (regardless of the value of the feedback signal) is effectively disconnected from terminal 1. When transistor P3 is on, the conduction path of transistor P2 is connected between terminal 14 and 1 through the conduction path of transistor P3. Similarly, transistor N3 either couples or disconnects the conduction path of transistor N2 between terminals 1 and 16.

Transistors N3 and P3 ensure that the circuit can switch from one state to the other regardless of the ratio of impedances of transistors P2 and N2 to the impedances of the the other transistors in the circuit. Due to N3 and P3, the circuit cannot latch into one or the other of the two possible conditions. However, transistors P3 and N3 have to be made relatively large if the effect of transistors P2 and N2 is not be masked. That is, transistors P3 and N3 have to be made relatively large to enable the circuit to have a large hysteresis gap, where the hysteresis gap is defined as the difference between $E_P$ and $E_N$. This drawback is minimized in the circuit of FIG. 3.

Figure 3:
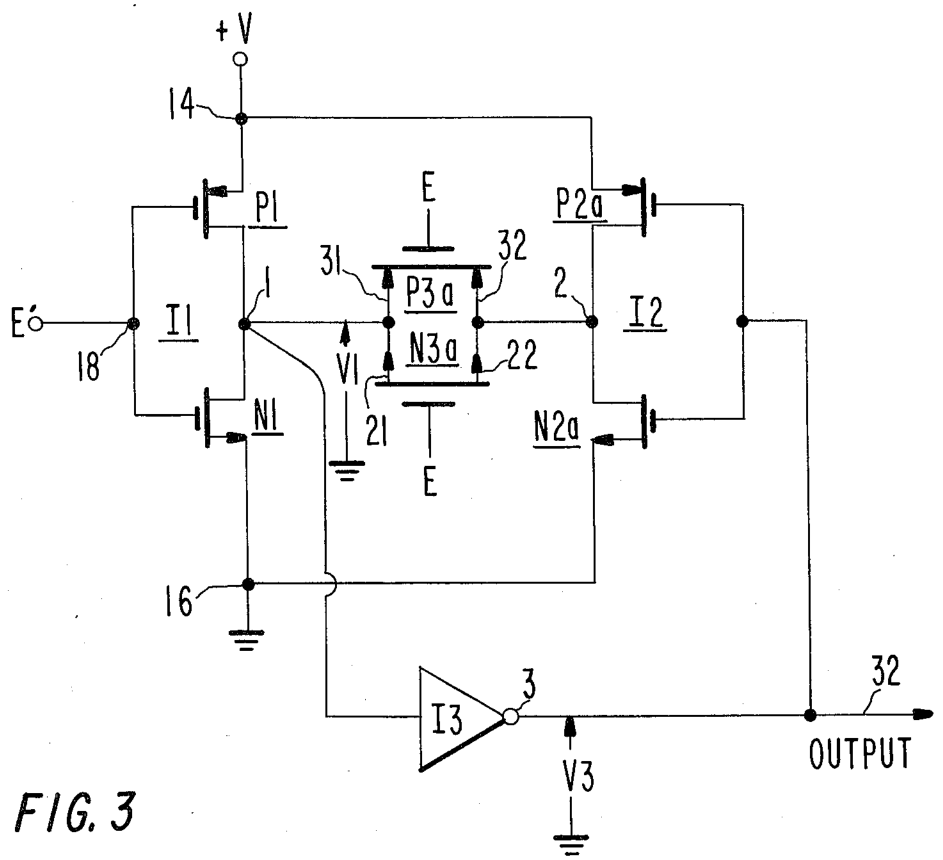
FIG. 3 is a schematic diagram of another circuit embodying the invention.

FIG. 3 (like FIG. 2) includes inverter I1 comprised of transistors P1 and N1, and output inverter I3. Connecting points $Y_1$ and $Y_2$ of FIG. 2 in common produces the circuit of FIG. 3. Transistors P3*a* and N3*a* have their source-drain paths connected in parallel between terminals 1 and 2. The input signal, labelled E, is applied to the gate electrodes of transistors P1, N1, P3*a* and N3*a*. A second inverter, 12, includes transistors P2*a* and N2. The source-drain path of transistor P2*a* is connected between terminals 14 and 2 and the source-drain path of transistor N2*a* is connected between terminals 2 and 16. Third inverter I3 is connected at its output terminal 3 to the gate electrodes of transistors P2*a* and N2*a*. The most positive operating potential, labelled +V, is applied to terminal 14 and the most negative operating potential, ground, in this example, is applied to terminal 16.

Figure 4:
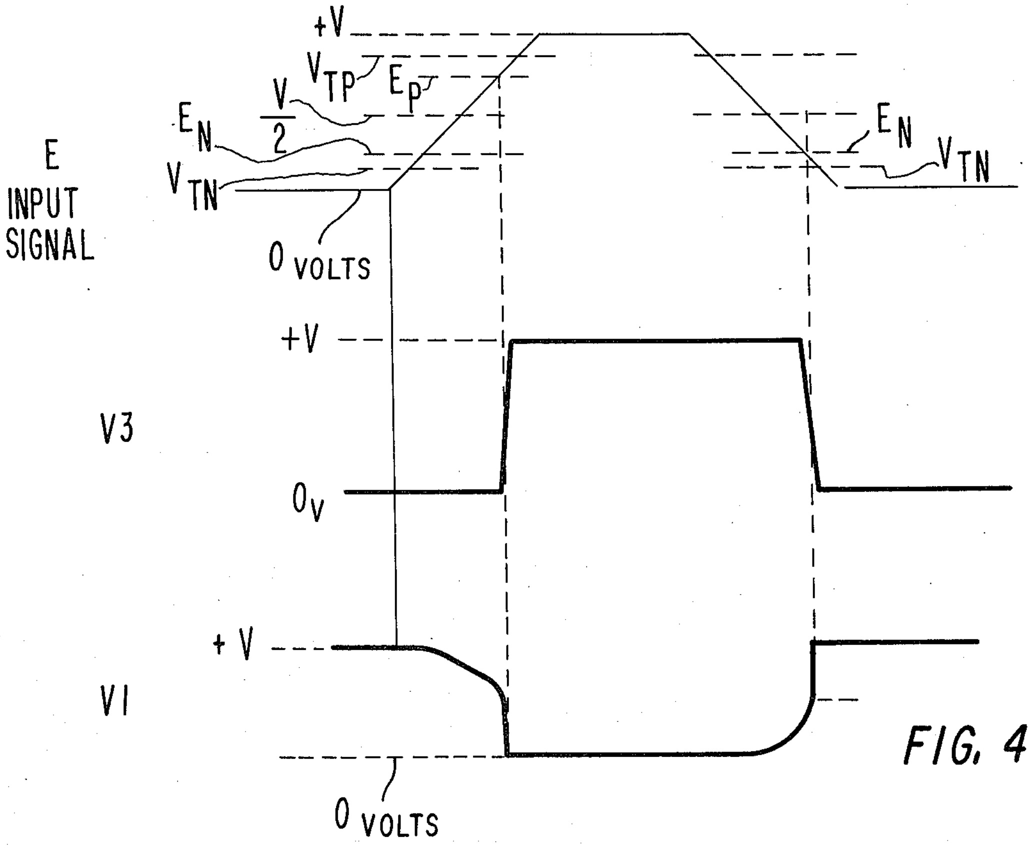
FIG. 4 is a diagram of several waveforms associated with the circuit of FIG. 3.

The operation of the circuit of FIG. 3 will be explained with reference to FIG. 4 which illustrates the waveforms at terminals 1 and 3 for E going from 0 volts to +V volts and then returning to 0 volts.

1. When E is at zero volts, the circuit behaves identically to that of FIG. 2. Transistors P1 and P3*a* are biased on and transistors N1 and N3*a* are cut off. V1 is at +V volts and V3 is low. With V3 low, transistor P2*a* is turned on and transistor N2*a* is cut off. Consequently, for $E=0$ volts, the network connected between terminals 14 and 1 includes the on impedance of transistor P1 in parallel with the series on impedances of transistors P2*a* and P3*a*. The net equivalent impedance of transistors P1, P2*a* and P3*a* connected between terminals 1 and 14 is, therefore, considerably lower than the one impedance of transistor P1 alone. Transistors N1, N2*a* and N3*a* being cut off, the impedance of the circuit between terminals 1 and 16 is many orders of magnitude greater than the impedance of the network between terminals 1 and 14 and may be considered to be an open circuit. The potential V1 is at, or close to, +V volts and there is little, if any, power dissipation.

2. When E increases to $V_{TN}$ volts, transistor N1 starts conducting. But, the impedance of transistor N1 is very high in comparison to the equivalent impedance of transistors P1, P2*a* and P3*a* which are fully on. V1 is close to +V volts and V3 is low. With V3 low, transistor P2*a* remains turned on and transistor N2*a* remains cut off.

3. As E increases above $V_{TN}$, transistors P1, P2*a* and P3*a* are all on and conduct current from terminal 14 into terminal 1. In addition, transistor N1 conducts more and more causing the potential V1 at terminal 1 to decrease. At this point an important aspect of the invention embodied in the circuit of FIG. 3 occurs. As E minus V1, (E—V1), increases above $V_{TN}$ transistor N3*a* starts to conduct. But, whereas transistor N1 conducts in the common source mode transistor N3*a* conducts in the source follower mode.

The potential at terminal 1 is lower than the potential ($V_2$) at terminal 2. If in addition the potential at the gate of transistor N3*a* is more positive (by $V_{TN}$) than the potential at terminal 1, transistor N3*a* conducts current from terminal 2 (its drain) to terminal 1 (its source). That is, electrode 21 of transistor N3*a* acts as its source electrode and electrode 22 acts as its drain electrode. Thus, as E increases and V1 decreases, transistor N3*a* conducts current from terminal 2 to terminal 1.

During this transition period there are two parallel paths between terminals 1 and 2. One path includes the on impedance of transistor P3*a* conducting in the common source mode while the other path includes transistor N3*a* conducting in the source follower mode. The net equivalent impedance between terminals 1 and 14 is thus decreased and tends to prevent a change of state in the circuit. Note that the equivalent impedance of the circuit between terminals 1 and 14 is now equal to $Z_{P1}$ in parallel with the combination of $Z_{P2a}$ in series with the parallel combination of $Z_{P3a}$ and $Z_{N3a}$. For the trigger point $E_P$ to be reached the impedance of transistor N1 must be less than the impedance of the circuit between terminals 1 and 14.

It should be appreciated that the operation of transistor N3*a* in parallel with transistor P3*a* is equivalent to having a transistor P3*a* of much larger size (i.e. one having a lower on impedance). The use of transistor N3*a* permits transistor P3*a* to be a smaller device (i.e. one having higher impedance) than would otherwise be required. Thus, transistor P3*a* takes up less space, resulting in a circuit requiring less area.

4. As E continues to increase above V/2 volts the conduction of transistors P1 and P3*a* decreases and that of transistors N1 and N3*a* continues to increase, eventually the trigger point is reached when the impedance of the network between terminals 1 and 14 is slightly greater than the impedance of the circuit between terminals 1 and 16. When this occurs, V1 goes below V/2, and $V_3$ goes high which causes a sharp transition in the circuit. Transistor P2*a* is cut off and transistor N2*a* is turned on. Transistor N3*a* is also on but now conducts current from terminal 1 to terminal 2. Electrode 22 of transistor N3*a* now acts as its source electrode and electrode 21 acts as its drain electrode. The impedance between terminals 1 and 16 is now relatively low and the impedance between terminals 1 and 14 is very high. V1 remains low for all values of E greater than the value of $E=E_P$ causing V1 to go below 50% of +V volts.

5. When E decreases and reaches ($V-V_{TP}$) volts transistor P1 is turned on but its impedance is high in comparison to the impedance of transistors N1, N2*a* and N3*a* and V1 remains close to zero volts.

6. As E continues to decrease below ($V-V_{TP}$) volts, transistors N1, N2*a* and N3*a* are all on and conduct current from terminal 1 into terminal 16. In addition, transistor P1 conducts more and more causing the potential V1 at terminal 1 to rise. As E decreases to $V_{TP}$ volts below V1 transistor P3a starts to conduct. But, whereas transistor P1 conducts in the common source mode transistor P3a conducts in the source follower mode.

The potential at terminal 1 is higher than the potential ($V_2$) at terminal 2. If in addition the potential at the gate of transistor P3*a* is less positive (by $V_{TP}$) than the potential at terminal 1, transistor P3*a* conducts current from terminal 1 (its source) to terminal 2 (its drain). That is, electrode 31 of transistor P3*a* acts as its source electrode and electrode 32 acts as its drain electrode. Thus, as E decreases and V1 increases, transistor P3*a* conducts current from terminal 1 to terminal 2.

During this transition period there are two parallel paths between terminals 1 and 2. One path includes the on impedance of transistor N3*a* conducting in the common source mode while the other path includes transistor P3*a* conducting in the source follower mode. The net equivalent impedance between terminals 1 and 16 is thus decreased and tends to prevent a change of state in the circuit. Transistor P3*a*, thus, functions in a similar, though complementary, manner to that described for transistor N3*a* above. The operation of transistor P3*a* in parallel with transistor N3*a* is equivalent to having a transistor N3*a* of much larger size (i.e. one having a lower on impedance). The use of transistor P3*a* permits transistor N3*a* to be a smaller device (i.e. one having high impedance) than would otherwise be required. Thus, transistor N3*a* takes up less space, resulting in a circuit requiring less area.

Transistors P3 and N3, thus, function as a complementary transmission gate during the transition period when either E is increasing and is greater than $V_{TN}$, but less than $E_p$ or E is decreasing and is less than $(V-V_{TP})$ volts, but greater than $E_N$.

7. As E decreases still further to $E_N$ the point is reached when the impedance of transistor P1 is slightly less than the impedance of the circuit between terminals 1 and 16. At that point ($E_N$) which is the negative trigger point, V1 goes above V/2 and $V_3$ goes low. This causes transistor P2*a* to turn on and transistor N2*a* to turn off. Transistor P3*a* is also on and conducts in the common source mode having its conduction path connected in series with that of transistor P2*a* between terminals 14 and 1.

8. As E returns to 0 volts the initial conditions described above are reestablished.

For the conditions of $E=0$ volts and $E=+V$ volts the circuit of FIGS. 2 and 3 behave in substantially identical fashion. It is only for the transition period between the two extreme levels that the circuit of FIG. 3 enables smaller sized transistors to be used for the same hysteresis gap.

Figure 5:
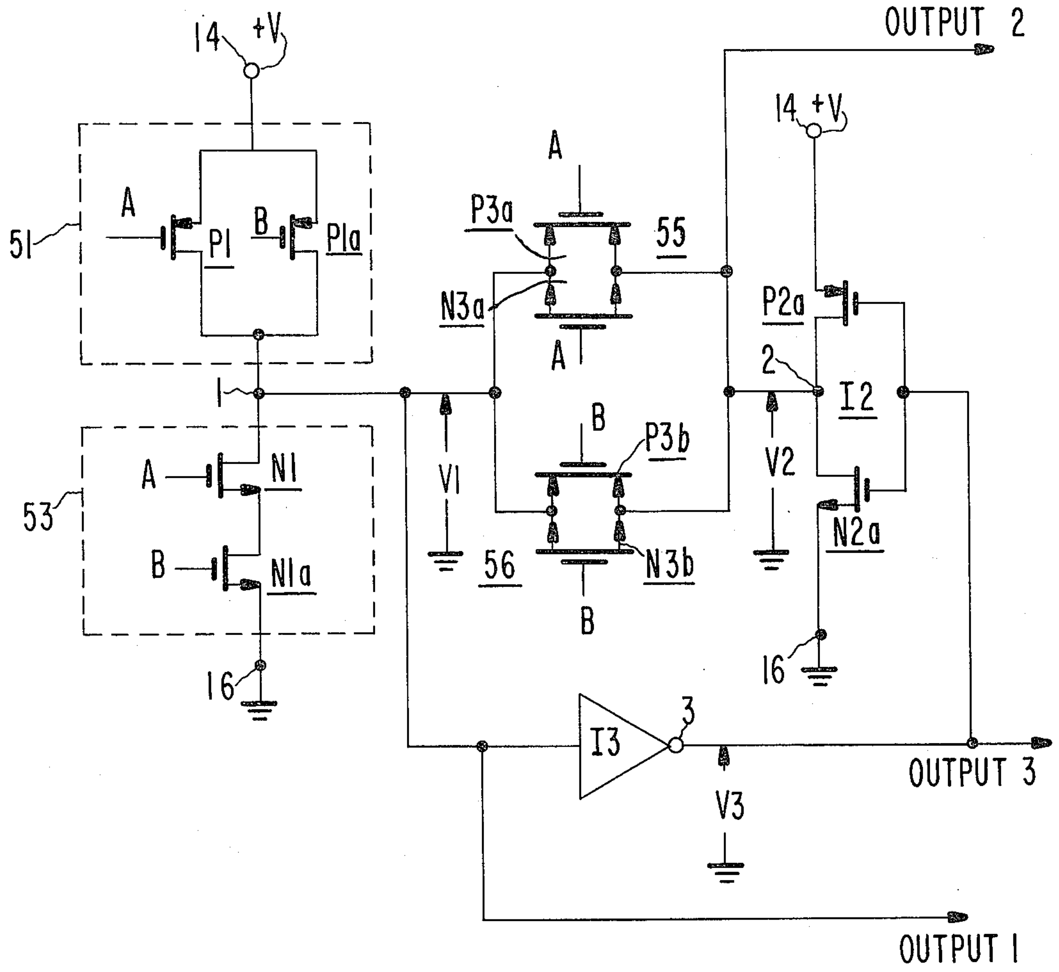
FIG. 5 is a schematic diagram of a NAND gate embodying the invention.

The circuit of FIG. 5 is a two input NAND SCHMITT TRIGGER embodying the invention. Transistor P1 and P1*a*, in box 51, have their conduction paths connected in parallel between terminals 14 and 1 and transistors N1 and N1*a*, in box 53, have their conduction paths connected in series between terminals 1 and 16. An input signal labelled B is applied to the gates of transistors P1*a* and N1*a*. Transistors N1, N1*a*, P1 and P1*a* form a standard two input NAND gate. Hysteresis is provided to the circuit by the addition of inverters I3 and I2 and transmission gates 55 and 56 which couple the output of inverter I2 to output terminal 1. Transistors P3*a* and N3*a* and transistors P3*b* and N3*b* have their conduction paths connected in parallel between terminals 1 and 2 and form transmission gates 55 and 56, respectively. Inverter I2, which corresponds to I2 of FIG. 3, includes transistor P2*a* having its source drain path connected between terminals 14 and 1 and transistor N2*a* having its source drain path connected between terminals 1 and 16. Inverter I3, corresponding to the similarly numbered inverter of FIG. 3, is connected at its input to terminal 1 and at its output 3 to the gates of transistors P2*a* and N2*a*.

The operation of the circuit of FIG. 5 is similar to that of FIG. 3, and need not be detailed. In the circuit of FIG. 5 the combination of two input signals (A and B) control the conductivity of transistors P1, P1*a*, N1 and N1*a*. The response of the circuit with two transistors in each of portions 51 and 53 is more complex than when a single transistor is used. However, the operation and analysis of the circuit is similar to that described above. Inverter I3, as in the circuits of FIG. 2 and 3, feeds back a signal to the gates of transistors P2*a* and N2*a*. The overall feedback signal, as in the case of FIGS. 2 and 3, is positive. That one of transistors P2*a* and N2*a* is turned on which causes the initiating signal (V1) to be reenforced. There is one transmission gate per input signal for coupling the conduction path of transistors P2*a* or N2*a* to output terminal 1. The transmission gates behave in a similar manner to that detailed for transistors P3*a* and N3*a* in FIG. 3. Outputs may be derived from terminals 1, 2 and 3, with outputs 1 and 2 being in phase with each other and out-of-phase with the signal produced at terminal 3. Transistors P1 and P1*a* could, alternatively, be connected in series between terminals 14 and 1 and transistors N1 and N1*a* could be connected in parallel between terminals 1 and 16. In the alternate connection the circuit would function as a two input NOR gate exhibiting hysteresis.

Portions 51 and 53 of the circuit could be replaced by other means which in response to a given condition of the input signals connects the output terminal 1 to one point of operating potential and which in response to a different level of the input signals connect the output terminal to the other point of operating potential.

What is claimed is:

1. The combination comprising:

first and second terminals for the application therebetween of an operating potential;

an input point for the application thereto of an input signal and an output connection;

first and second transistors, each transistor having a conduction path and a control electrode for controlling the conductivity of its conduction path; means connecting the control electrodes of said first and second transistors to said input point; means connecting one end of the conduction path of said first transistor to said first terminal; means connecting one end of the conduction path of said second transistor to said second terminal; means connecting the other end of the conduction paths of said first and second transistors to said output connection;

third and fourth transistors, each transistor having a conduction path and a control electrode;

feedback means connected between said output connection and the control electrodes of said third and fourth transistors; and coupling means responsive to one value of the signal applied at said input point for connecting the conduction path of said third transistor through a relatively low impedance path between said first terminal and said output connection and responsive to another value of the signal applied to said input point for connecting the conduction path of said fourth transistor through a relatively low impedance path between said output connection and said second terminal.

2. The combination as claimed in claim 1 wherein said coupling means includes fifth and sixth transistors of first and second conductivity type, respectively, having their conduction paths connected in parallel between said output connection and one end of the conduction paths of said third and fourth transistors and wherein said input signal is applied to the control electrodes of said fifth and sixth transistors; and wherein said first and second transistors are of first and second conductivity type, respectively.

3. The combination as claimed in claim 2 wherein said third and fourth transistors are of first and second conductivity type, respectively; and wherein the other end of the conduction path of said third transistor is connected to said first terminal and wherein the other end of the conduction path of said fourth transistor is connected to said second terminal.

4. The combination as claimed in claim 3 wherein said feedback means includes an inverter having an input and an output; and wherein said inverter is connected at its input to said output connection and at its output to the control electrodes of said third and fourth transistors.

5. The combination as claimed in claim 4 wherein each one of said transistors is an insulated-gate field effect transistor; and wherein said first conductivity type is one of N and P conductivity type and wherein said second conductivity type is the other one of said N and P conductivity type.

6. The combination as claimed in claim 1 wherein said coupling means includes fifth and sixth transistors of first and second conductivity type, respectively;

wherein the conduction path of said fifth transistor is connected in series with the conduction path of the third transistor between said first terminal and said output connection;

wherein the conduction path of said sixth transistor is connected in series with the conduction path of said fourth transistor between said output connection and said second terminal; and wherein said input signal is applied to the control electrodes of said fifth and sixth transistors.

7. The combination as claimed in claim 6 wherein said transistors are insulated gate field effect transistors.

8. The combination as claimed in claim 1 wherein said means connecting one end of the conduction path of said second transistor to said second terminal includes at least one additional transistor having its conduction path connected in series with the conduction path of said second transistor.

9. The combination as claimed in claim 8 further including at least one additional transistor having its conduction path connected in parallel with said first transistor.

10. The combination as claimed in claim 1 wherein said means connecting one end of the conduction path of said second transistor includes at least one additional transistor having its conduction path connected in series with the conduction path of said second transistor; and further including:

another additional transistor having its conduction path connected in parallel with the conduction path of said first transistor;

a second input point for the application thereto of a second input signal;

means connecting the control electrodes of said additional transistors to said second input point; and second coupling means responsive to one value of the signal applied to said second input point for connecting the conduction path of said third transistor through a relatively low impedance path between said first terminal and said output connection and responsive to another value of the signal applied at said second input point for connecting the conduction path of said fourth transistor through a relatively low impedance path between said output connection and said second terminal.

11. The combination as claimed in claim 1 further including:

N additional input points, where N is an integer; one additional pair of transistors per additional input point, where each pair of transistors includes one transistor having its conduction path connected in series with said second transistor and one transistor having its conduction path connected in parallel with said first transistor;

an additional coupling means per additional input point; each coupling means comprised of two transistors having their conduction paths connected in parallel between said output connection and the conduction paths of said third and fourth transistors; and means connecting each additional input point to the control electrodes of one of said additional pair of transistors and to the control electrodes of the transistors of one of said additional coupling means.

12. The combination as claimed in claim 11 wherein one transistor of each pair of transistors and one transistor of each coupling means is of one conductivity type and wherein the other transistor of each pair of transistors and of each coupling means is of the opposite conductivity type.

13. The combination as claimed in claim 1 wherein said means connecting one end of the conduction path of said second transistor includes at least one additional transistor having its conduction path connected in series with the conduction path of said second transistor; and further including:

another additional transistor having its conduction path connected in parallel with the conduction path of said first transistor;

a second input point for the application thereto of a second input signal;

means connecting the control electrodes of said additional transistors to said second input point; and wherein said coupling means includes two transistors having their control electrodes connected to said second input point and two transistors having their control electrodes connected to the same input point as said first and second transistors; and wherein the conduction paths of said coupling means transistors are coupled between the conduction paths of said third and fourth transistors and said output connection.

14. The combination as claimed in claim 13 wherein one transistor in each set of said two transistors is of one conductivity type and wherein the other transistor in each set of said two transistors is of opposite conductivity type.

15. The combination as claimed in claim 1 further including N additional input points, where N is an integer; one additional pair of transistors per additional input point, where each pair of transistors includes one transistor having its conduction path connected in series with said second transistor and one transistor having its conduction path connected in parallel with said first transistor;

wherein said coupling means includes two additional transistors per additional input point having their conduction paths coupled between said output connection and the conduction path of said third and fourth transistors; and means connecting each additional input points to the control electrodes of one of said additional pair of transistors and to the control electrodes of two of said additional transistors in said coupling means.

16. In combination with a circuit having one section connected between a first power terminal and an output connection and a second section connected between said output connection and a second power terminal, said circuit being responsive to one or more input signals switching on one of said first and second sections and switching off the other one of said first and second sections, means for altering the switching points of said circuit and making said switching points dependent on the direction of the signal, comprising:

first and second variable impedance means each having a conduction path and a control electrode whose applied potential controls the conductivity of the path;

coupling means responsive to one value of the input signals applied to said first and second sections for connecting the conduction path of said first impedance means through a relatively low impedance path between said first terminal and said output connection and responsive to another value of the input signals applied to said first and second sections for connecting the conduction path of said second impedance means through a relatively low impedance path between said output connection and said second terminal; and feedback means connected between said output connection and the control electrodes of said first and second variable impedance means.

* * * * *

UNITED STATES PATENT OFFICE

CERTIFICATE OF CORRECTION

PATENT NO. : 3,904,888

DATED : September 9, 1975

INVENTOR(S) : Roger Thomas Griffin, et al

It is certified that error appears in the above-identified patent and that said Letters Patent are hereby corrected as shown below:

Col. 1, line 67 change closed to ---close---.

Col. 2, line 41 change transistor to ---transistors---.

Col. 5, line 13 change signal to ---signals---.

line 26 change V,/2 to --- V/2,---.

line 60 change condition to --- conduction---.

Col. 7, line 23 change on to --- "on"---.

line 24 change on to --- "on"---.

line 28 change one to ---on---.

line 43 change $V_{TN}$. to --- $V_{TN}$, ---.

Col. 8, line 12 change on to --- "on"---.

Col. 9, line 2 change on to ---"on"---.

line 31 change Transistor to --- Transistors---.

line 40 change 13 to ---I3---.

Signed and Sealed this

*tenth* Day of *February 1976*

[SEAL]

*Attest:*

RUTH C. MASON
*Attesting Officer*

C. MARSHALL DANN
*Commissioner of Patents and Trademarks*